(12) United States Patent
Hamann et al.

(10) Patent No.: US 7,129,560 B2
(45) Date of Patent: Oct. 31, 2006

(54) THERMAL MEMORY CELL AND MEMORY DEVICE INCLUDING THE THERMAL MEMORY CELL

(75) Inventors: Hendrik F. Hamann, Mohegan Lake, NY (US); Martin Patrick O'Boyle, Cortlandt Manor, NY (US); H. Kumar Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/401,564

(22) Filed: Mar. 31, 2003

(65) Prior Publication Data

US 2004/0188668 A1    Sep. 30, 2004

(51) Int. Cl.
   *H01L 29/00* (2006.01)
(52) U.S. Cl. ............... 257/529; 257/499; 257/528; 257/E31.029
(58) Field of Classification Search ............... 257/3
   See application file for complete search history.

(56) References Cited

U.S. PATENT DOCUMENTS

| | | | |
|---|---|---|---|
| 5,243,858 A | * | 9/1993 | Erskine et al. |
| 5,402,435 A | * | 3/1995 | Shiono et al. |
| 5,444,651 A | * | 8/1995 | Yamamoto et al. |
| 5,843,561 A | * | 12/1998 | Uwazumi et al. |
| 6,433,310 B1 | | 8/2002 | Wickramasinghe et al. |
| 6,448,576 B1 | * | 9/2002 | Davis et al. |
| 6,545,287 B1 | * | 4/2003 | Chiang |
| 6,815,705 B1 | * | 11/2004 | Klersy et al. |
| 2002/0101673 A1 | | 8/2002 | Wickramasinghe et al. |
| 2002/0101795 A1 | | 8/2002 | Wickramasinghe et al. |
| 2002/0101812 A1 | | 8/2002 | Wickramasinghe et al. |
| 2002/0192853 A1 | * | 12/2002 | Behammer |
| 2004/0027908 A1 | * | 2/2004 | Ooishi et al. |

OTHER PUBLICATIONS

Gao, et al., "Reversible Nanometer-Scale Conductance Transitions in an Organic Complex", Physical Review Letters, vol. 84, No. 8, Feb. 21, 2000, pp. 1780-1783.
Peng, et al., "Experimental and Theoretical Investigations of Laser-Induced Crystallization and Amorphization in Phase-Change Optical Recording Media", American Institute of Physics, J. Appl. Phys., 82 (9), Nov. 1, 1997, pp. 4183-4191.
Lai, et al., "OUM-A 180nm Nonvolatile Memory Cell Element Technology for Stand Alone and Embedded Application", Intel Corporation, 4 pages total.
Gill, et al., "Ovonic Unified Memory-A High-Performance Nonvolatile Memory Technology for Stand-Alone Memory and Embedded Applications", IEEE international Solid-State Circuits Conference 2002, ISSCC 2002 / Session 12 / TD: Digital Directions / 12.4, Feb. 5, 2002, 3 pages total.
Peng, et al., "Measurement of the Thermal Conductivity of Erasable Phase-Change Optical Recording Media", Applied Optics, vol. 39, No. 14, May 10, 2000, pp. 2347-2352.

* cited by examiner

*Primary Examiner*—Nathan J. Flynn
*Assistant Examiner*—Kevin Quinto
(74) *Attorney, Agent, or Firm*—Stephen C. Kaufman, Esq.; McGinn IP Law Group, PLLC

(57) ABSTRACT

A memory cell includes a storage medium having a programmable thermal impedance, and a heater in thermal communication with the storage medium for programming the thermal impedance. In another aspect, a memory cell includes a storage medium having a programmable electrical impedance, and a heater in thermal communication with the storage medium for programming the electrical impedance. In a third aspect, a memory device includes a plurality of the memory cells in accordance with the first and/or second aspect of the present invention.

43 Claims, 12 Drawing Sheets

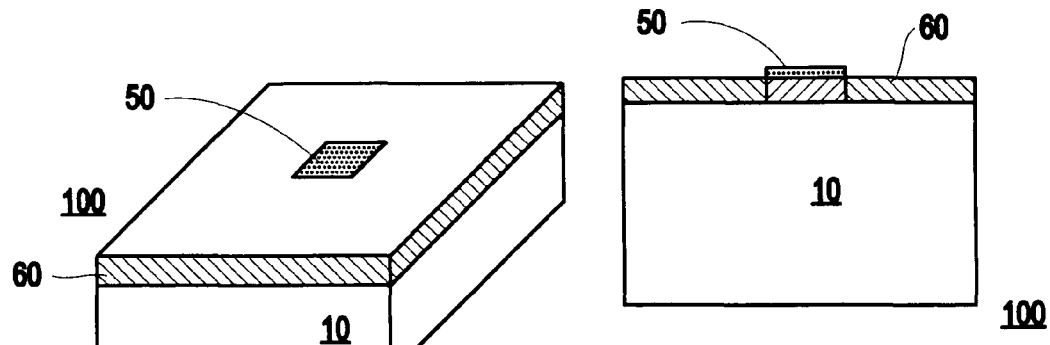
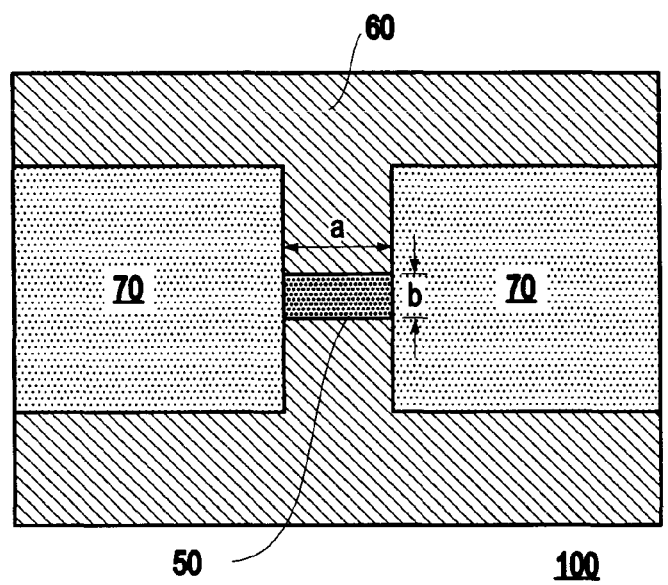
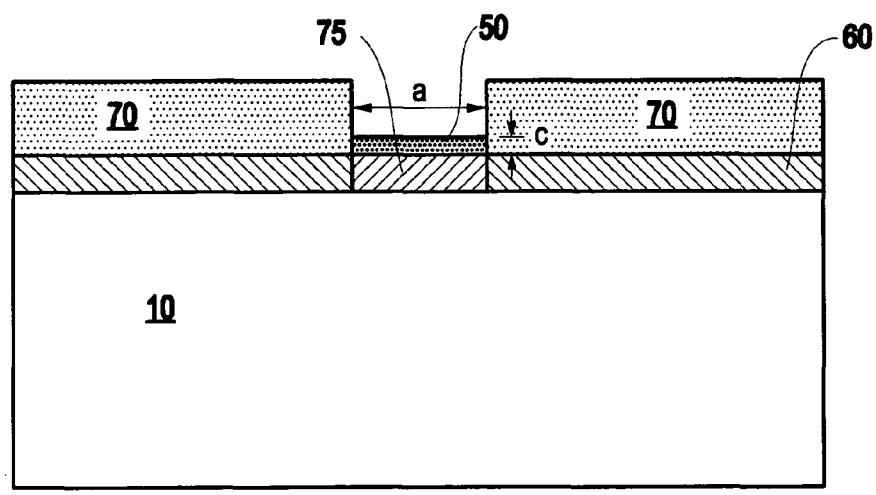

| ACTION | HEATER TEMPERATURE [°C] | HEATER RESISTANCE [Ω] | POWER IN HEATER [mW] | THERMAL RESISTANCE [K/mW] | HEATER CURRENT [mA] | HEATER VOLTAGE [mV] |
|---|---|---|---|---|---|---|
| STANDBY | 20 | 30 | - | - | - | - |
| WRITE (AMORPHIZATION) | 520 | 75 | 0.556 | 900 | 2.72 | 204 |
| ERASE (CRYSTALLINE) | 320 | 57 | 0.150 | 2000 | 1.62 | 92 |
| READ AMORPHOUS BIT | 167 | 43.1 | 0.073 | 2000 | 1.3 | 56 |
| READ CRYSTALLINE BIT | 73 | 34.8 | 0.059 | 900 | 1.3 | 45 |

FIG.3

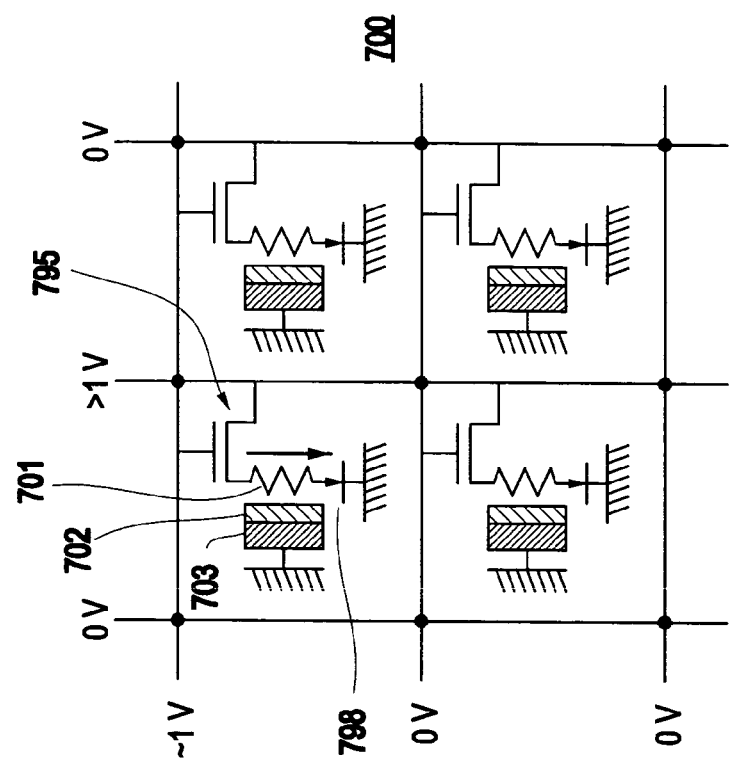
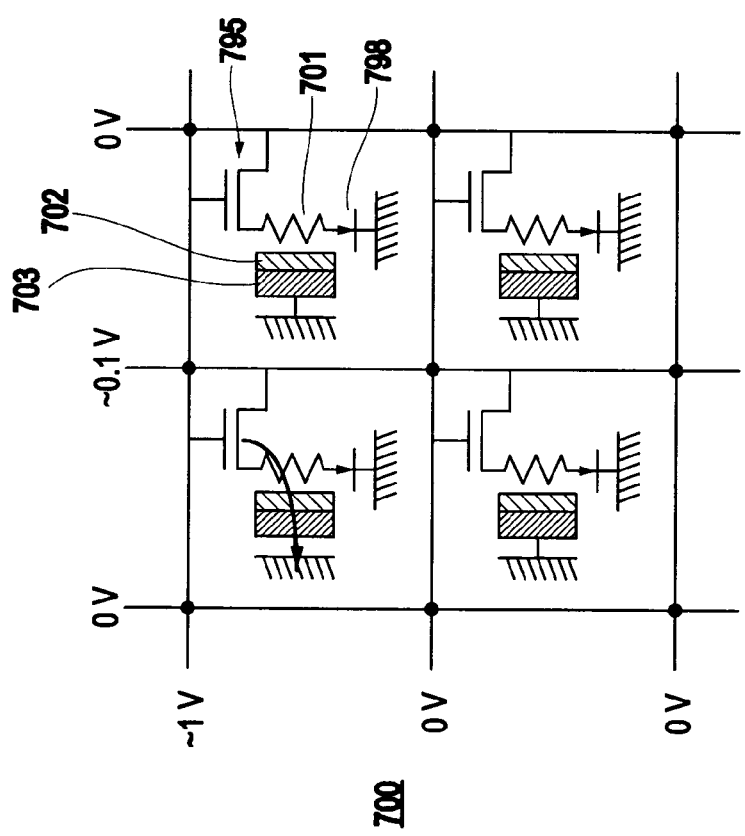
FIG.7C
FIG.7D

THERMAL MEMORY CELL AND MEMORY DEVICE INCLUDING THE THERMAL MEMORY CELL

CROSS REFERENCE TO RELATED APPLICATIONS

This Application is related to U.S. patent application Ser. No. 09/773,346 filed on Jan. 31, 2001, entitled "An assembly suitable for reading/writing/erasing information based on thermal coupling", having U.S. patent application Ser. No. 09/774,851 filed on Jan. 31, 2001, entitled "An assembly suitable for reading data based on thermal coupling", having U.S. patent application Ser. No. 09/774,943 filed on Jan. 31, 2001, entitled "An assembly for writing and/or erasing high density data on a media", having U.S. patent application Ser. No. 09/773,323 filed on Jan. 31, 2001, entitled "A method for writing and/or erasing high density data on a media", all of which are assigned to International Business Machines Corporation and are incorporated herein by reference.

BACKGROUND OF THE INVENTION

1. Field of the Invention

The present invention generally relates to a thermal memory cell/device for reading/writing and erasing information and more particularly, a thermal memory cell/device in which a primary current path for reading/writing/erasing of information does not necessarily involve the storage medium.

2. Description of the Related Art

While conventional memory devices are volatile (i.e., DRAM, SRAM), the demand for a non-volatile (as well as cheap, low power consuming and high density) memory technology has been risen sharply, in particular triggered by the emergence of mobile phones, computers, camcorders etc. Towards this end, several non-volatile memory technologies are being developed such as magnetic tunnel junction RAM (MTJ-RAM), ferroelectric RAM (FERAM) as well as phase-change RAM.

The latter of these technologies is typically based on chalcogenide materials (e.g., GeSbTe alloys), the phase of which can be reversibly programmed between phases (e.g., amorphous and polycrystalline. Specifically, amorphization is accomplished by heating the media above the melting temperature (about 500° C.) and then rapidly cooling with a rate of about $10^9$ K/s. Crystallization is achieved by moderate heating of the media below the melting temperature but above the glass temperature (about 300° C.). The amorphous and crystalline phases exhibit very different physical properties, by which reading of the stored information can be accomplished. For example, the amorphous state has higher electrical resistivity and lower optical reflectivity than the crystalline state.

Such phase-change memory devices have been proposed and some of the concepts have been demonstrated (e.g., see U.S. Publication No. US20020039306A1, U.S. Pat. No. 3,271,591, U.S. Pat. No. 6,314,014, U.S. Pat. No. 6,087,674, U.S. Pat. No. 5,825,046, U.S. Pat. No. 5,714,768, U.S. Pat. No. 5,166,758, U.S. Pat. No. 4,924,436, U.S. Pat. No. 4,876,667, U.S. Pat. No. 5,296,716, and U.S. Pat. No. 6,314,014).

However, a careful look at the prior art reveals that all of these inventions utilize the electrical resistance change of the two phases for reading the state of the cell. Consequently, in all of these assemblies, the primary current path for reading/writing/erasing is realized directly through the phase-change media.

Although, due to the large difference in electrical resistivity between the amorphous and crystalline state (about a factor of 100) the read dynamic range is substantial, this approach is accompanied with several problems, which are discussed in more detail below.

Specifically, phase-change media (i.e., $Ge_2Sb_2Te_5$) typically exhibit fairly large electrical resistivities, roughly on the order of about $10^{-1}$ $\Omega$m and about $10^{-3}$ $\Omega$m for the amorphous and (poly)crystalline phase, respectively. For example, for a 180 nm memory cell, which has been recently demonstrated (e.g., see M. Gill et al, "Ovonics Unified Memory: A high performance nonvolatile memory technology for stand alone memory and embedded applications" 2002 IEEE International Solid—State Circuits Conference, page 202), the electrical resistance of the amorphous phase is about 85 k$\Omega$ and about 2 k$\Omega$ for the amorphous and crystalline phase, respectively.

Clearly, such large electrical resistances can cause major problems if they are part of the write/erase circuit. For example, in order to switch the amorphous phase "back" to the crystalline phase, a substantial voltage has to be applied in order to dissipate enough power for sufficient heating. Although Poole-Frenkel conduction through the phase-change media lowers the device impedance at bias fields of larger than $3 \times 10^5$ V/cm, the high temperatures in combination with large electric fields may easily irreversibly degrade (e.g., by breakdown, which is strongly temperature dependent) the phase-change material, and therefore compromise the device performance.

In addition, as a further complication, the resistance of the phase-change media above the glass temperature is very low, which makes the controlling of the write/erase process very difficult.

SUMMARY OF THE INVENTION

In view of the aforementioned problems and disadvantages associated with conventional devices, it is a purpose of the present invention to provide a memory cell/device which offers a solution to possible problems (e.g., degradation of the phase-change material) associated with conventional phase-change memory cells. Specifically, the present invention provides a memory cell in which the primary current path for reading/writing/erasing does not necessarily involve (i.e., is outside of) the storage medium (e.g., the phase-change media) directly.

In a first aspect, the inventive memory cell includes a storage medium having a programmable thermal impedance, and a heater in thermal communication with the storage medium for programming the thermal impedance. Further, a primary current path for reading/writing/erasing of information to the storage medium may be outside of the storage medium.

Specifically, the heater may program the thermal impedance by heating the storage medium. In addition, the heater may be utilized as a temperature sensor to infer or measure the thermal impedance of the storage medium to read information. Further, the heater may be controlled to write information to the storage medium, and read/erase information from the storage medium.

Further, an electrical resistance of the heater may be used to read information. For example, the electrical resistance of the heater may be changed by a stray current path. Further, the heater may be electrically insulated from the storage medium.

The storage medium may include a phase-change medium which has a phase-dependent thermal impedance. Further, a first phase of the phase-change medium has a first thermal impedance, and a second phase of the phase-change medium has a second thermal impedance which is different from the first thermal impedance. The phase-change medium may include an amorphous phase and a crystalline phase. In this case, information may be written to the storage medium by heating the storage medium from a crystalline phase to an amorphous phase. Further, information may be erased from the storage medium by heating the storage medium from an amorphous phase to a crystalline phase.

The memory cell may also include a substrate formed in close vicinity to the storage medium. Specifically, the substrate may be formed adjacent to (e.g., in directly underneath) the storage medium. Further, the substrate may include at least one of silicon, copper and carbon for thermal conduction. The memory cell may also include at least one lead connected to the heater, for supplying power to the heater.

More specifically, the heater may be formed on the storage medium and include at least one of a posistor material, a ceramic material, an oxide and a semiconductor material. Further, the heater may include at least one of a tunnel junction, thermocouple, negative temperature coefficient thermistor, and positive temperature coefficient thermistor.

The storage medium may include, for example, at least one of Ga, Sb, In, Se, Te, Ag, Pt and Fe. The storage medium may also include conjugate organic materials.

The storage medium may also include a bit region located in close vicinity to the heater, so that the the thermal impedance is programmed in the bit region. Specifically, the bit region may be formed in the substrate and adjacent to (e.g., in directly underneath) the storage medium. Further, the phase of material in the bit region may be only partially converted during writing and/or erasing. In addition, each thermal impedance of bit region may represent a different bit, so that the storage medium has a capacity for storing more than two different bits.

For example, the storage medium may have a first thermal impedance representing a "1" bit stored in the storage medium, and a second thermal impedance representing a "0" bit stored in the storage medium. Further, the storage medium may include a phase change medium having more than two phases, each phase having a different thermal impedance. In this case, each thermal impedance may represent a different bit, so that the storage medium has a capacity for storing more than two different bits.

The memory cell may also include a temperature sensor. In this case, instead of the heater, the temperature sensor may be used to measures/infer the thermal impedance of the storage medium to read information. For example, the temperature sensor may include at least one of a tunnel junction, thermocouple, negative temperature coefficient and positive temperature coefficient thermistors.

In another aspect, the inventive memory cell includes a storage medium (e.g., phase-change medium) having a programmable electrical impedance, a heater in thermal communication with the storage medium for programming the electrical impedance, and a counter-electrode in electrical communication with the storage medium. Further, a primary current path for writing/erasing of information to the storage medium may be outside of the storage medium.

Specifically, in this aspect, the heater may program the electrical impedance by heating the storage medium. Further, the counter-electrode may facilitate a detection of the electrical impedance, to read information from the storage medium. Further, the heater may be controlled to write data to and erase data from the storage medium, and act as an electrode to read data from the storage medium.

Further, in this aspect, the storage medium (e.g., phase-change medium) may have a phase-dependent electrical impedance. Further, the storage medium may include a bit region located between the heater and counterelectrode, and wherein the electrical impedance is programmed in the bit region. Further, the phase of material in the bit region may be partially converted during at least one of writing and erasing.

In addition, each electrical impedance of the bit region may represent a different bit, so that the storage medium stores more than two different bits. The storage medium may have, for example, a first electrical impedance representing a "1" bit stored in the storage medium, and a second electrical impedance representing a "0" bit stored in the storage medium.

In addition, the storage medium may include a phase change medium having more than two phases, each phase having a different electrical impedance. In this case, each electrical impedance may represent a different bit, so that the storage medium has a capacity for storing more than two different bits.

The present invention further includes a memory device which includes a plurality of the inventive memory cells. For example, each memory cell may include a storage medium having a programmable thermal impedance, and a heater in thermal communication with the storage medium for programming the thermal impedance.

The inventive memory device may also include at least one control device to facilitate writing information to and erasing information from the storage medium, and to read information from the storage medium. For example, the control device may include a plurality of transistors, The control device may also include a plurality of diodes. For example, the transistors and diodes may be individually associated with a memory cell.

In another aspect, the memory cells in the inventive memory device may include a storage medium having a programmable electrical impedance, a heater in thermal communication with the storage medium for programming the electrical impedance, and a counter-electrode in electrical communication with the storage medium, for facilitating a reading of the electrical impedance by the heater. In this case, the control device may facilitate writing information to and erasing information from the storage medium, and to read information from the storage medium.

The present invention also includes an assembly having a storage media with a programmable thermal impedance, a heater in thermal communication with the storage media for programming the thermal impedance to write information to and erase information from the storage media, a temperature of the heater being one of inferred and measured as a function of the thermal impedance to read the information, at least one lead to supply current to the heater, and a heat sink in thermal communication with the storage media.

In another aspect, the assembly may include a storage media having a programmable electrical impedance, a heater in thermal communication with the storage media for programming the electrical impedance to write information to and erase information from the storage media, an electrical impedance of the storage medium being detected to read the Information, at least one lead to supply current to the heater, and a counter-electrode to facilitate a reading of electrical impedance of the storage media.

The present invention also includes an information processing method which includes programming a thermal impedance of a storage medium to write information to and erase information from the storage medium, and one of inferring and measuring a temperature of the heater as a function of the thermal impedance to read the information.

In another aspect, the information processing method may include programming an electrical impedance of a storage medium to write information to and erase information from the storage medium, and detecting an electrical impedance of the storage medium to read the information.

The present invention also includes a programmable storage medium tangibly embodying a program of machine-readable instructions executable by a digital processing apparatus to perform the information processing method.

With its unique and novel features, the present invention provides a memory cell which makes controlling of the write/erase process much easier than in conventional devices. Specifically, the present invention provides a memory cell in which the primary current path for reading/writing/erasing does not necessarily involve the storage medium (e.g., the phase-change media) directly.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A–D illustrate a memory cell 100 according to a first aspect of the present invention;

FIG. 3 illustrates Table 1 which includes data pertaining to a generalized example of the memory cell according to the present invention

FIGS. 7A–7D illustrate a memory device 700 which may include the inventive memory cell according a third aspect of the present invention.

DETAILED DESCRIPTION OF PREFERRED EMBODIMENTS OF THE INVENTION

Figure 2A:
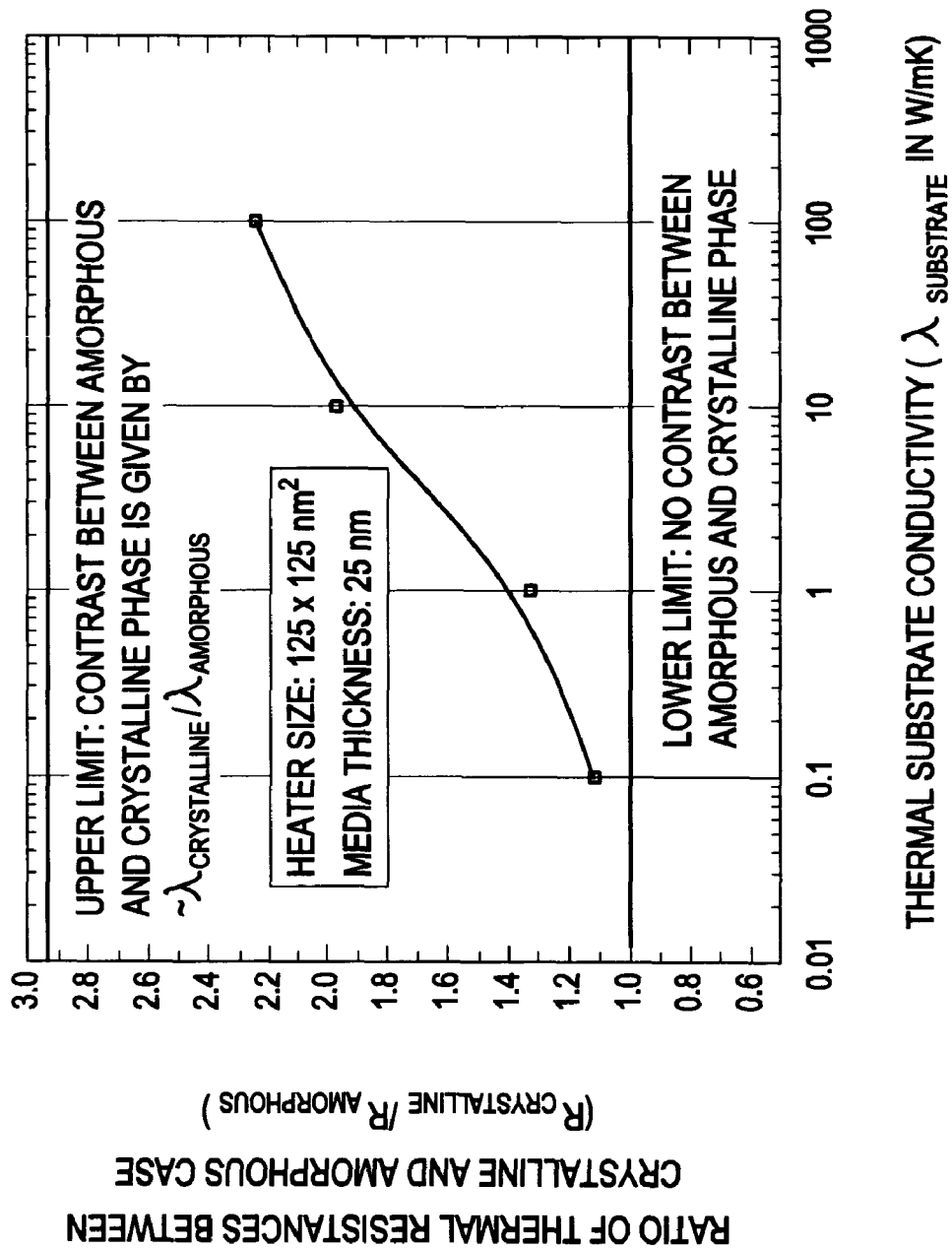
FIGS. 2A–D provide modeling data graphs which illustrate the physical principles for reading the thermal impedance of the phase-change material with a heater in accordance with the first aspect of the present invention.

Referring now to the drawings, and more particularly to FIGS. 1A–1B, the present invention includes a thermal memory cell 100 for storing information. The memory cell 100 includes a storage medium 60 having a programmable thermal impedance, and a heater 50 (e.g., a resistive heater) in thermal communication with the storage medium 60 for programming the thermal impedance.

Specifically, the heater 50 (e.g., a "virtual" heater in the form of a surface heat load) may be used to process information (e.g., writing/erasing/reading) in the memory cell 100. In addition, the storage medium 60 may include a phase-change medium such as an amorphous/crystalline phase-change medium. The memory cell 100 may also include a substrate 10 on which the storage medium 60 is formed, and which may function as a heat sink.

The present invention recognizes some of the above-referenced problems of the conventional phase-change memory devices and addresses them by realizing writing and erasing via heating (e.g., indirect heating). That is, in the present invention the primary current path for writing/erasing does not involve the phase-change media directly and therefore, has clear advantages over conventional devices.

Specifically, the writing and erasing may be realized indirectly by a heater, which may be in thermal, but is not necessarily in electrical contact with a phase-change media. This invention is also clearly distinguished from recent memory cell developments, where an "alleged" heater is used as one of the electrodes (e.g., M. Gill et al, "Ovonics Unified Memory: A high performance nonvolatile memory technology for stand alone memory and embedded applications" 2002 IEEE International Solid-State Circuits Conference, page 202). In such recent developments, although one electrode is proposed to be used as a heater to supply thermal energy to the phase-change material, the current path for writing and erasing still includes the phase-change media. In fact, it may not be evident how practical it is to fabricate such heater electrodes (i.e., the heater resistance has to be most likely higher than the phase-change resistance) when the phase-change resistances are in the kΩ range.

In any event, regardless of practicalities, the present invention realizes the feasibility of heating (e.g., indirect heating) for such a phase-change memory cell, and thereby avoids several problems of conventional phase-change memory, such as problems that arise from heating (e.g., direct heating which passes current through the memory cell). In addition to possible enhanced media duration, another advantage of the claimed invention is that the heater material can be chosen much more independently in the present invention than in conventional memory, since the heater material resistance is not "determined" by the extraordinary high resistivity of the phase-change media.

First Aspect

Referring again to FIGS. 1A–1B, in a first aspect of the present invention, the memory cell 100 (e.g., memory element) may include a storage medium (e.g., phase-change medium) 60, having a thermal impedance. The memory cell 100 also includes a heater 50 capable of processing information (e.g., reading/writing/erasing data) to/from the storage medium 60. Specifically, the heater 50 can be used to heat the storage medium 60 so as to vary the thermal impedance of the medium. In other words, the heater 50 may be controlled to program the thermal impedance of the storage medium 60. Further, the primary current path for information processing (e.g., writing to/reading from/erasing) on the storage medium 60 does not include the storage medium 60.

The physical principles of the present invention may be understood by using a simple example. Specifically, in the first aspect of the present invention, the heater 50 may be capable of reading data from a storage medium 60 as well as writing data to the medium 60 and erasing data from the medium 60.

For reading, the heater 50 may act as a temperature sensor. The physical principle for the reading process is based on the change of electrical resistance of the heater as a function of temperature. Since the temperature of the heater is determined by the thermal impedance of the storage media, the thermal impedance can be measured or inferred and thereby reading by realized. Consequently, it is important to design the memory cell 100 so that the largest temperature difference in the heater 50 for a given power is realized when the thermal impedance of the storage medium 60 is changed (e.g., when the phase is changed).

FIGS 1C–1D further illustrate the memory cell 100 according to this aspect of the present invention. Specifically, FIG. 1C illustrates a plan view of a memory device 100 in which such a heater 50 (e.g., surface heat load) may be realized by a thin heater (e.g., heating element) 50. For example, the heater 50 may be lithographically defined on the storage medium 60. The memory cell 100 may also include at least one lead 70 connected to the heater 50 for supplying current to the heater 50. Thermal losses through the leads 70 of the heater 50 may be assumed to be negligible for calculations herein. Further, as noted above, the memory device 100 may include a substrate (e.g., heat sink) 10.

As noted above, the heater 50 is suitable for writing/erasing/reading information on the storage media 60 which may store information therein. Specifically, the storage media 60 has a thermal impedance which can be programmed by controlling the heater 50.

As an example, the storage medium 60 may be assumed to be a phase-change material having a phase-dependent thermal impedance. For example, the thermal conductivity of the amorphous and crystalline form of the phase-change medium 60 may assumed to be about 0.17 W/mK and about 0.5 W/mK, respectively (C. Peng, L. Cheng, and M. Mansuripur, Experimental and theoretical investigations of laser-induced crystallization and amorphization in phase-change optical recording media J. Appl. Phys. 82, 4183 (1997)).

Specifically, via finite element methods, the temperature rise (e.g., steady state temperature rise) for a given power (i.e., thermal resistance (temperature rise/power)) may be calculated for the case where the phase of the storage medium 60 (e.g., the portion of the storage medium underneath the heater 50) is amorphous ($R_{amorphous}$), and then calculated for the case where the phase of the storage medium 60 (e.g., the portion of the storage medium underneath the heater) is crystalline ($R_{crystalline}$). The phase of the storage medium outside of the heater 50 (i.e., not underneath the heater) may be assumed to be crystalline.

FIG. 1C also illustrates a length a of the heater 50 and a width b of the heater 50, and FIG. 1D illustrates a thickness c of the heater 50. Further, FIG. 1D illustrates a bit region 75 which is the region of the storage medium 60 which may be used to store information (e.g., 1 bit of information). As shown in FIG. 1D, the bit region 75 may be located underneath the heater 50. It should also be noted that the substrate 10 which is shown, for example, in FIG. 1D may function as a heat sink for helping to dissipate heat in the storage medium 60.

It should be noted at this point that in some cases, the bit region may be only partially converted written and erased. This could be accomplished by controlling precisely the length and strength of the write and erase heat pulse. As a result it is conceivable to store more than 1 bit of information ("1" and "0") although the material has only two phases.

More specifically, the present invention may realize more "states" than phases of the storage medium 60. For example, this may be realized by only partially writing the bit region.

As an example, "0" may mean 100% crystalline, "1" may mean 80% crystalline and 20% amorphous, "2" may mean 60% crystalline and 40% amorphous etc. Further, in practice, the duration or intensity of the heat pulse could determine to which extent the bit regions is converted to crystalline.

However, in the following calculations it is assumed (for simplicity purposes) that the entire bit region is completely written or erased.

FIG. 2A provides a graph in which the ratio of the thermal resistances for the crystalline and amorphous phases is plotted as a function of the thermal conductivity of the substrate ($\lambda_{substrate}$). For purpose of these calculations, it was assumed that the heater size is 125×125 nm² (e.g. surface heat load) and the thickness of the medium is 25 nm. Again, heat losses through some leads for the heater have been neglected in this calculation.

As shown in FIG. 2A, with increased substrate thermal conductivity, the temperature ratio of the heater temperatures (e.g., for a given power) for the crystalline and amorphous bit is increased from initially 1.12 for $\lambda_{substrate}$=0.1 W/mK (e.g., plastics) to 2.24 for $\lambda_{substrate}$=100 W/mK (e.g., silicon). As it can be readily inferred from FIG. 2A, for very high thermal substrate conductivities ($\lambda_{substrate} \to \infty$) the contrast ratio between the amorphous and crystalline case may be maximized approaching the ratio of thermal conductivities between the crystalline and amorphous phase ($\lambda_{crystalline}/\lambda_{amorphous}$). In another extreme, for very low thermal substrate conductivities ($\lambda_{substrate} \to 0$) the contrast for an amorphous and crystalline bit vanishes.

The reason for this strong dependence on the thermal conductivity is readily explained. At high substrate thermal conductivity, the heat spot is limited to the initial heater (e.g., heat load) size and the heat flow is strongly vertically biased towards the substrate. Clearly, in such a situation the thermal conductivity of the storage medium directly underneath the heat load source is much more important than for scenarios where the heat flow is mostly horizontal. Based on the following arguments, in the present invention, very little heat spreading (e.g., the least amount of heat spreading) may be realized, which may help to make high density memory devices possible.

Figure 2B:
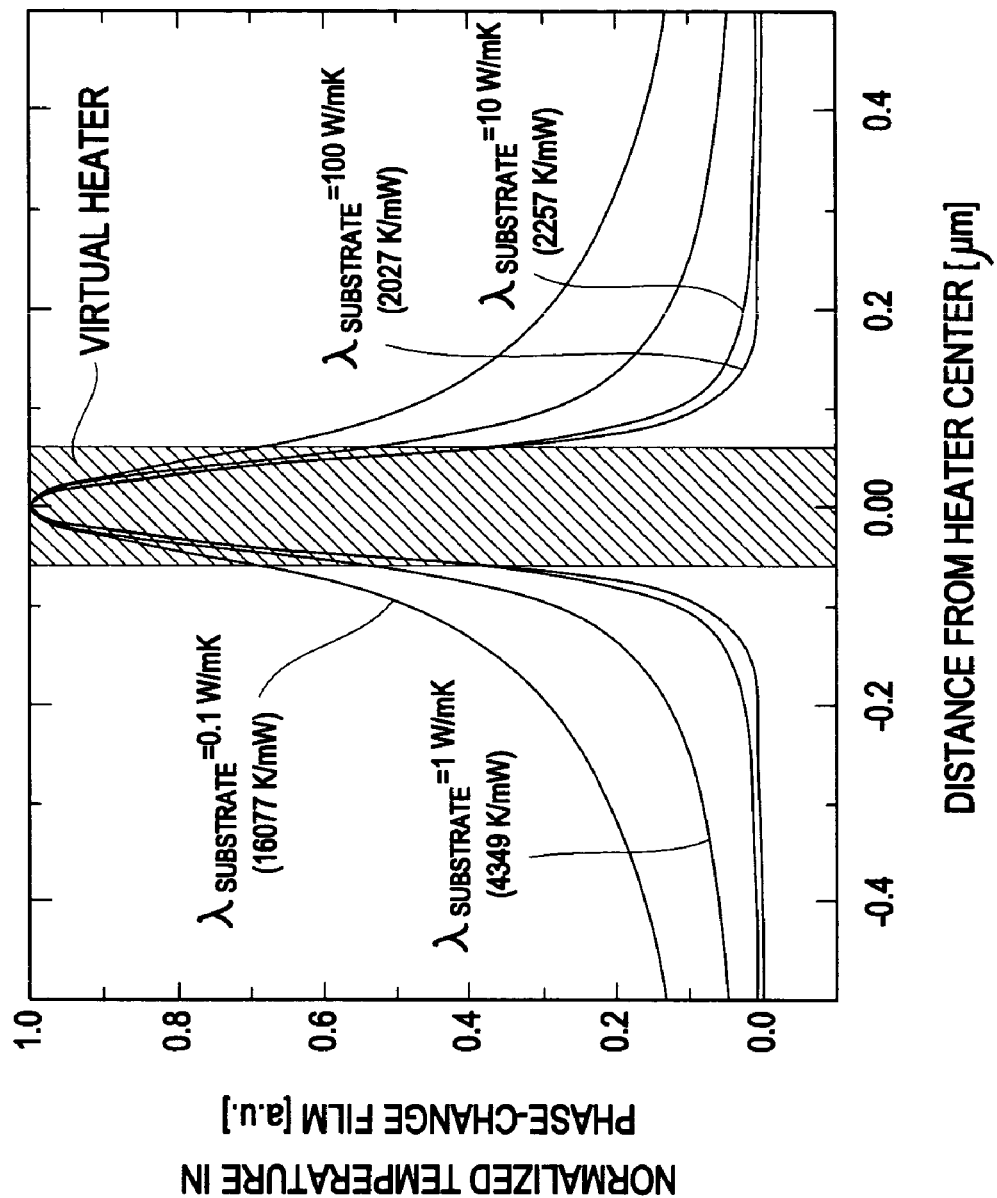

FIG. 2B provides a graph in which the normalized temperature profiles (for the amorphous case) in the phase-change media are shown as a function of substrate thermal conductivity. The corresponding thermal resistances for the different curves are written in brackets in the graph. FIG. 2B shows a much more localized temperature profile for higher thermal conductivity substrates. However, it needs to be realized that the amount of power which is needed for heating the media, is increased with increasing substrate thermal conductivity.

On the other hand, looking at the absolute numbers, the power needed to process data (e.g., read/write/erase) on the phase-change media are still very small. For example, with a silicon substrate ($\lambda_{substrate}$ about 100 W/mK), about 600 µW would be needed for the amorphization and about 150 µW for the crystallization process, which is still fairly low. Further, reading would require less power than 150 µW.

Figure 2C:
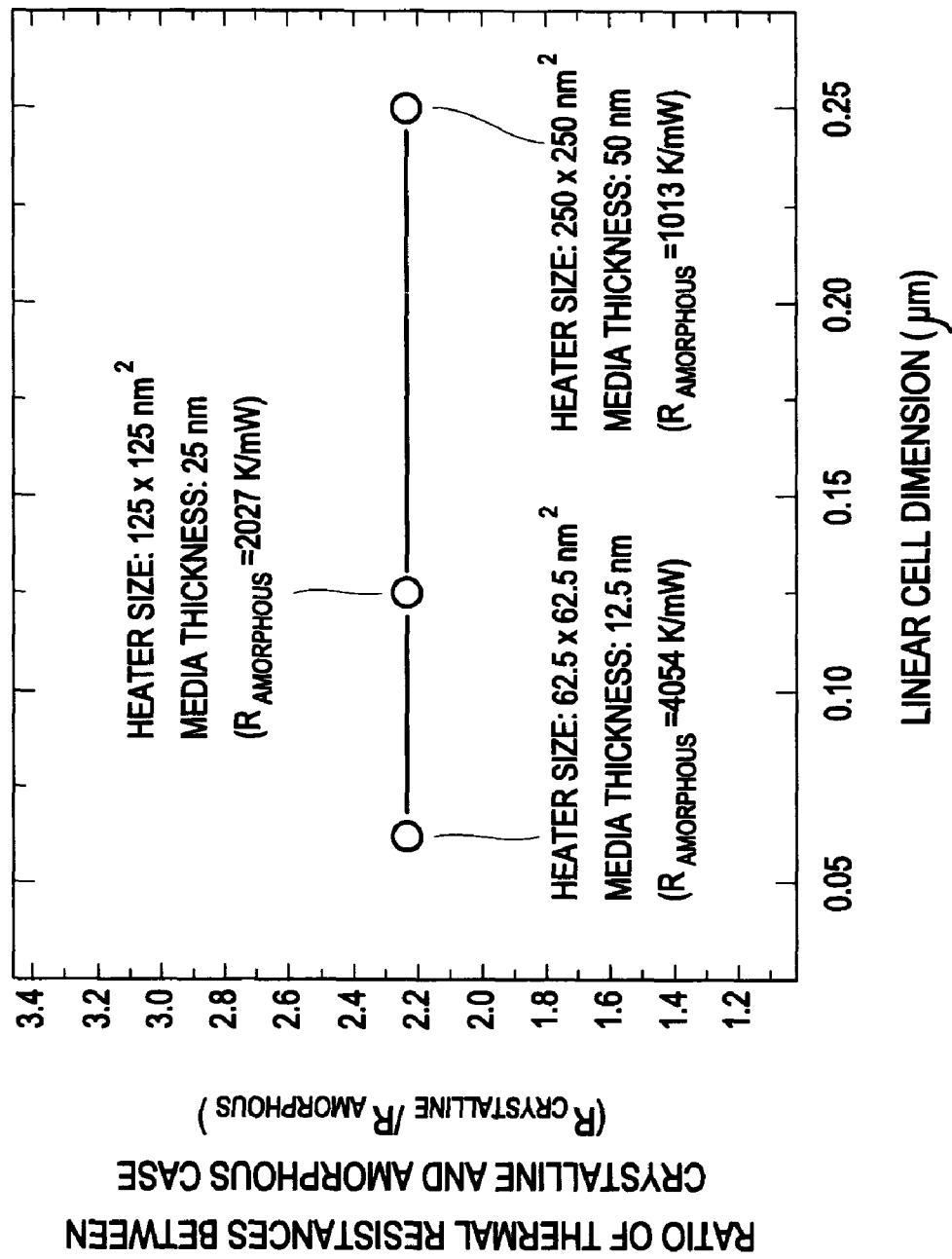

FIG. 2C provides a graph in which the ratio of thermal resistances for the amorphous and crystalline cases (for $\lambda_{substrate}$=100 W/mK) are plotted as a function of cell size (e.g., all three dimensions are scaled). FIG. 2C demonstrates that the proposed memory cell 100 is scalable. In fact, in terms of required power, decreasing the cell size by a factor of two may result in a power saving of a factor of two.

Figure 2D:
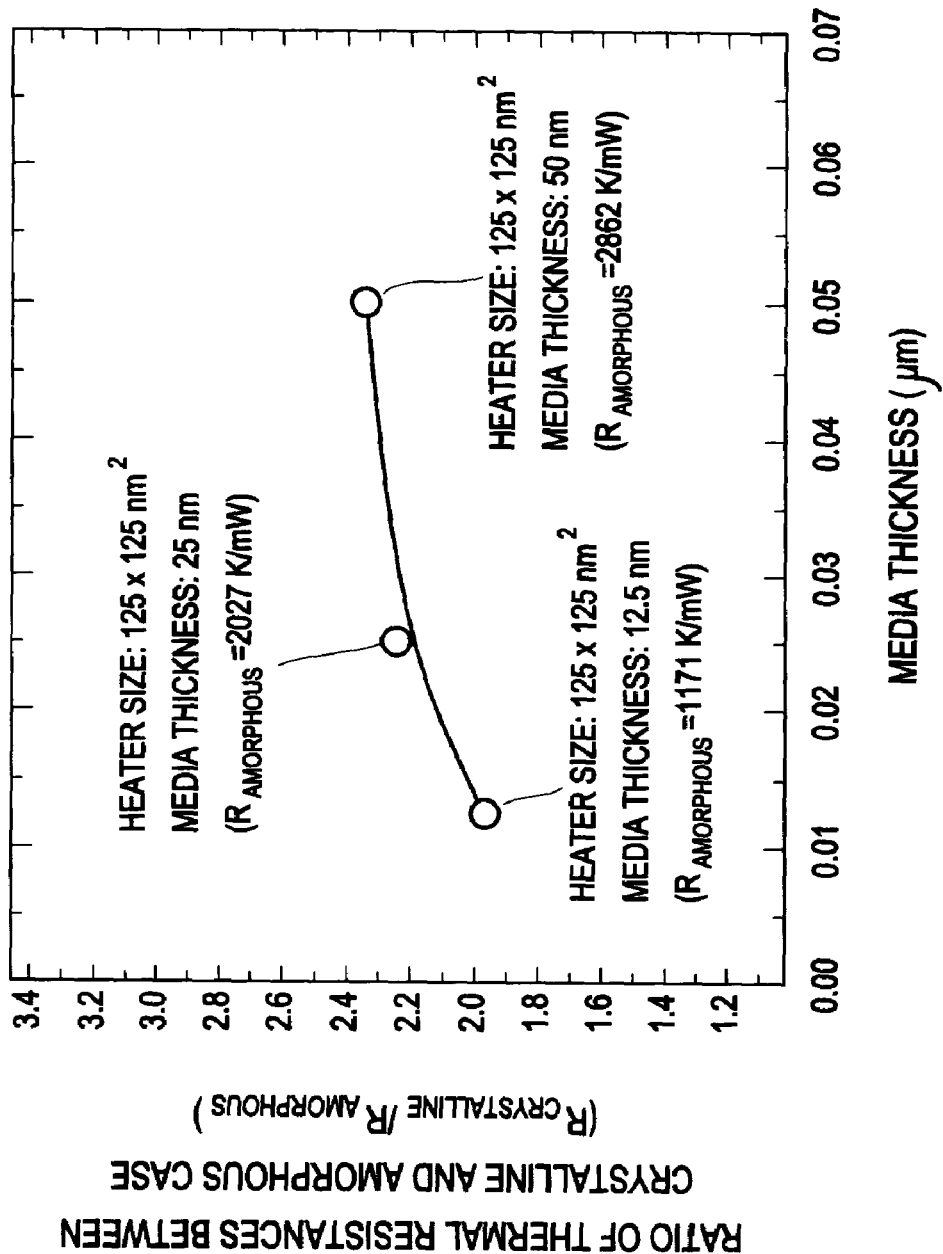

Further, FIG. 2D provides a graph which illustrates the dependence of the contrast ratio on the media thickness. A thicker media improves (e.g., to a certain extent) the contrast ratio. In addition, a slightly thicker media will slightly decrease the power consumption. However, if the media is too thick (e.g., thicker than the spot size), the effect is similar to that of a lower thermal conductivity substrate (e.g., see FIG. 2A), the contrast ratio is decreased.

The present invention may also consider how the temperature differences for the amorphous and crystalline case are sensed/read. For example, the electrical resistance change of the heater 50 as a function of temperature can be utilized to infer and/or measure the temperature of the heater 50 and thereby read (e.g., detect, sense, etc.) the phase of the recording media.

FIG. 3 provides Table 1 which shows operating conditions for a 125×125 nm² memory cell 100 on a silicon substrate ($\lambda_{substrate}$ about 100 W/mK). In Table 1, a 30 Ω square heater with a temperature coefficient of resistance (TCR) of $\alpha$=0.3% K$^{-1}$ (e.g., Platinum) is assumed.

Specifically, for an action taken (e.g., standby, write, erase, etc.), Table 1 provides the heater temperature which may be required to perform the action, heater resistance, power in heater, thermal resistance of the phase change media, heater current and heater voltage.

In these simple estimations, changes of the thermal resistances during the write/erase process may be neglected. Further, the ambient temperature may be assumed to be 20° C. The resulting temperature as a function of applied current may be estimated by:

$$T = \frac{R_o \cdot I \cdot R_{amorphous/crystalline}}{1 - \alpha \cdot R_o \cdot I \cdot R_{amorphous/crystalline}}$$

with $R_o$ as the cold heater electrical resistance and I as the applied current.

Table 1 demonstrates that, from this arrangement, a read contrast ratio between amorphous and crystalline bit of about 25% with a constant current of 1.3 mA can be expected. The heater temperatures which may be needed to perform a reading operation are 167° C. and 73° C. for the amorphous and crystalline phase, respectively, corresponding to heater resistances of 43.1 Ω and 34.8 Ω, respectively. The temperatures generated during the reading process does not alter or degrade the phase of the recording media.

While the data in Table 1 is just an illustrative example explaining the first aspect of the present invention, it can be easily shown that a heater having a larger temperature coefficient of resistance (TCR) may result into a significantly improved performance. For example, repeating the above estimations with a heater material with a TCR of about 1%/K, a contrast ratio of 82.5% at a constant current of 1 mA can be obtained. It should be noted at this stage that the circuit for the reading may include a constant current or constant voltage source.

During reading, the temperatures/resistance in the heater with a 1%/K TCR are 170° C. (75 Ω) and 57° C. (41.1 Ω) for the amorphous and crystalline phase, respectively. Again, these temperatures which may be important (e.g., needed) to realize the reading, are considerably lower than glass transition temperatures of these type of materials and, therefore, the reading process does not alter or degrade the phase of the recording media. Further improvements in the contrast between the amorphous and crystalline phase (e.g., besides larger TCR materials or other more sensitive temperature sensors) can be obtained by increasing the ratio of the thermal conductivities of the amorphous and crystalline phases, respectively.

Table 1 also shows the approximate electrical requirements for writing and erasing. One of the primary concerns of this design may involve the stability of the heater material at these fairly high temperatures. However, it needs to realized that in a typical memory application, the heater may not be used for an extended period of time. For example, considering a mobile data storage application, 10$^6$ write/erase cycles may be needed. More specifically, for writing (amorphization) the heater may need to maintain a temperature of about 520° C. for about 20 ns, adding up to about 20 ms (e.g., 20 ns/cycle×10$^6$ cycles) total time at 520° C.

Extensive experiments conducted by the inventors using photolithographically defined prototype heater structures, suggests that the resistance and TCR drifts at these temperatures are less than 1% per second. At lower temperatures these drifts are less significant so that during erasing (e.g., about 100 ns at about 320° C. adding up to 100 ms at 320° C.) or reading, no major change in the heater properties should occur.

An additional challenge of this design may lie in the fact that the lead(s) 70, which may supply the heater 50 with current, should have significantly less resistance than the heater 50, because any additional resistance in the current path will "dilute" the contrast ratio of the read out (leading to the second aspect of the present invention in which, instead of sensing the temperature of the heater, the cell may be "read" by measuring the electrical resistance across the memory cell 100).

Some details of the inventive memory cell 100 are provided below. However, these descriptions are merely provided as guidelines and should not be considered as limiting in any way.

Heater

The heater 50 may be used to write data to and/or erase data from the storage media 60 by heating (e.g., local heating). Although the heat can be generated by all means (e.g., laser heating), preferably the heater 50 includes Joule heating, where it is realized by an electrical resistor. In such case, the heater material selected may then be governed by the desired electrical resistance.

As a general guideline, the desired electrical resistance may be determined, for example, by the following circumstances: (a) available power supplies to drive the heater 50, which includes the possible load of the transistors used to address the memory cell, (b) possible dielectric breakdown of the storage media 60 (i.e., dielectric breakdown may constitute an upper limit to the resistance), and c) electro-migration of the heater 50 (i.e., electro-migration may constitute a lower limit to the electrical resistance). In addition, it is important to have a stable heater 50 with minor drifts in electrical and thermal properties during its operation.

In one aspect (e.g,. FIGS 1A–1D) the heater 50 and sensor (e.g., for a read operation) may be the same device. In other words, the heater 50 may be used to sense the thermal impedance of the phase-change material of the storage medium 60. In this case, it is preferred that the heater 50 is formed of a material having a large TCR, such as a positor material (e.g., SiC, ceramics, oxides (e.g., VO$_2$) etc.) or semiconductor material, where temperature coefficients of several percent per degree can be obtained.

As is clear from the above discussion, such a heater 50 formed of a large TCR-material will greatly enhance the contrast of the reading scheme. The heater 50 (e.g., sensor)

may also include tunnel junctions, thermocouples or NTC (negative temperature coefficient) or PTC (positive temperature coefficient) thermistors.

It should be noted, however, that although it may be preferred that heater and sensor are realized by the same device, it does not has to be necessarily the case. As discussed in great detail, for example, in U.S. patent application Ser. No. 09/774,851 which is incorporated herein by reference, there are many different kinds of temperature sensors, many of which can be used in the present invention.

Further, the dimensions of the heater 50 are basically unlimited. On the other hand, referring to FIG. 1C, since the memory cell dimensions (and thus a memory chip capacity as discussed below) are governed by the heater 50, a small heater structure (e.g., a, b <1 micron) may be preferred. In certain cases, a serpentine-like heater structure may be preferred to boost the resistance of the heater 50.

In addition, it may be preferred that the heater 50 shares a large surface area with the storage medium 60, in order to have good thermal conductance between the heater 50 and the storage medium 60. Typically, this leads to a very thin (e.g., c <<a, b) heater 50 as illustratively, for example, in FIGS. 1C–1D (and FIGS. 4A–4B as discussed below).

Storage Media

In principle, any kind of storage medium can be used in the claimed invention. Preferably, however, a storage medium is chosen, which shows the largest difference in thermal impedances depending on the heating conditions. For example, phase-change chalcogenide materials (e.g., GasSb, InSb, GaSeTe, AgInSbTe etc.) which are commonly used in compact disc and DVD applications, may be very good candidates.

In addition, conjugated organic materials (e.g., see Gao et al., "Reversible, Nanometer-Scale Conductance Transitions in an Organic Complex" Phys. Rev. Lett. 84, 1780 (2000)) show large differences in thermal as well as electrical impedances. In terms of thermal reading, low thermal conductivity materials (e.g., materials having a thermal conductivity less than 1 W/mK, which may include conjugated organic materials ) as a storage medium 60 may be preferred since they enhance the thermal reading contrast.

In addition, it is preferred that the programming via heating can be realized as fast as possible. For example, in the case of phase-change materials, crystallization requires 100 ns of heat treatment while amorphization can be realized in less than 10 ns. If the switching kinetics of a material is too slow, a quasi-parallel operation may be preferred (e.g., if a plurality of the memory cells are used). At this point, it should be emphasized that the storage medium 60 may include several distinguishable thermal/electrical impedance states making multidimensional (e.g., 2 or more) data storage possible. It should also be noted that the storage medium can include different materials having different dielectric constants etc.

Leads

Referring again to FIG. 1C–1D, the heater 50 preferably includes at least one lead 70 to supply current to the heater 50. As is clear, the resistance of the lead(s) 70 should be minimized for at least the following reasons: a) to avoid stray Joule heating of the phase-change media, and b) to enhance the reading contrast. Since for high density applications the heater 50 is not elongated (e.g., to increase the resistance), the lead(s) 70 are preferred to be thicker than the heater and made from a different (e.g., lower resistivity) material (e.g. a metal such as copper or aluminum) than the heater 50.

Heat Sink

The storage medium 60 is preferably arranged on a substrate 10 which is a good heat sink such as silicon, metals, carbon etc. For example, the heat sink (e.g., substrate 10) may include a laminate having different layers of materials. As already discussed in detail, the thermal conductivity of the heat sink is preferably high in order to enhance the thermal read contrast ratio. In some cases, non-electrical conductors are preferred in order to minimize dielectric breakdown through the storage medium (e.g., the phase-change material).

At this stage, the memory cell 100 shown in FIGS. 1C–1D may also alter the heater (e.g., sensor) resistance due to a change in the electrical resistance of the storage medium 60 (e.g., the phase-change material), whereby a stray current path through the storage medium 60 is provided in parallel to the heater 50. Again, such an arrangement does not include the primary current path through the storage medium 60 and is, therefore, clearly distinguished from the prior art.

Second Aspect

Figure 4A:
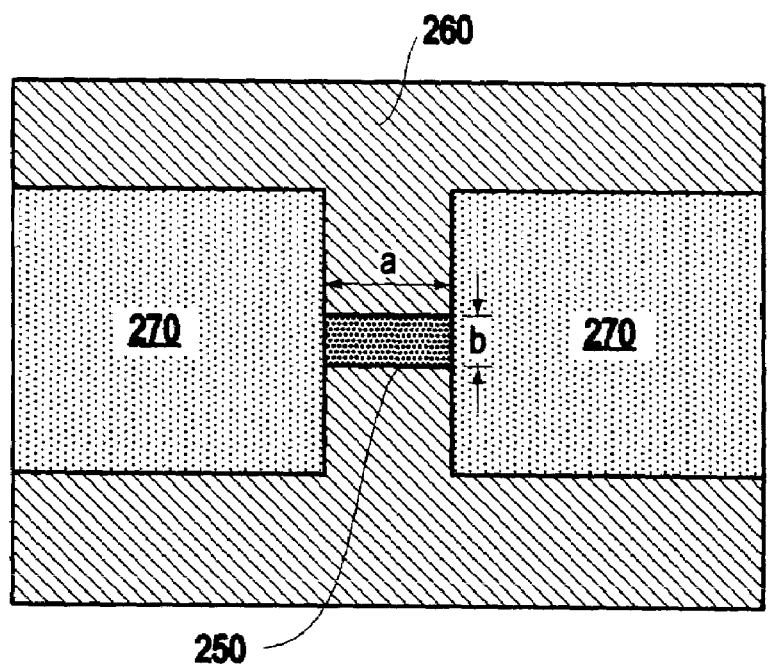
FIGS. 4A–B illustrate a memory cell 200 according to a second aspect of the present invention.
Figure 4B:
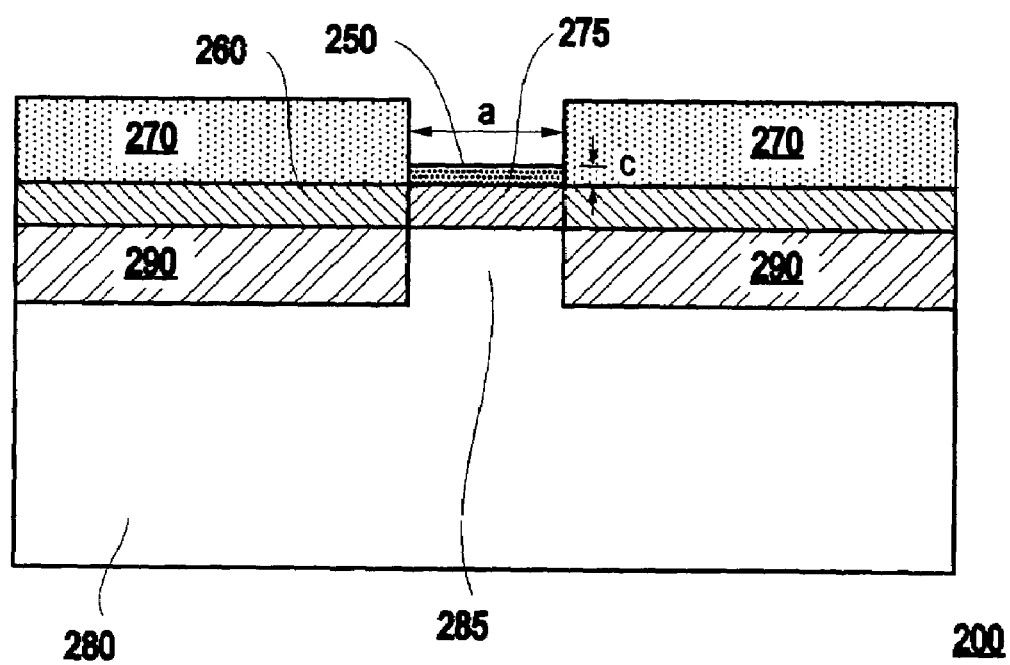

FIGS. 4A–4B illustrate a memory cell 200 according to a second aspect of the present invention. The inventive memory cell 200 includes a storage medium 260 having a programmable electrical impedance, a heater 250 in thermal communication with the storage medium for programming the electrical impedance, and a counter-electrode 285 in electrical communication with the storage medium 260. The memory cell 200 may include a primary current path (e.g., for writing data to/erasing data from a storage medium) which does not involve the storage medium 260.

Specifically, the electrical impedance of the storage medium 260 can be programmed by controlling the heater 250. That is, the heater 250 may heat the storage medium 260 to change the electrical impedance of the storage medium 260. Therefore, the heater 250 may be used for writing data to/erasing data from the storage medium 260. Moreover, the heater 250 may be used (e.g., along with the counter-electrode 280) as an electrode to read data from the storage medium 260. Specifically, the counter-electrode (e.g., conductor) 285 may be used to detect the electrical impedance (e.g., resistance) of the storage medium 260, thereby facilitating a reading of the information stored in the storage medium 260.

Specifically, these figures show a generalized version of the present invention. Further, the current path (e.g., for writing data to/erasing data from a storage medium) still does not involve the storage medium (e.g., phase-change media) and, therefore, has clear advantages over conventional devices.

Further, to perform a reading operation in this aspect, the present invention may utilize the electrical resistance change of the different phases of the storage medium 260 (e.g., storage material). In this scheme the heater 250 may act as one electrode for the read circuit, and a counter-electrode (e.g., conductor) 285 may be placed in thermal communication with (e.g., underneath) the storage medium 260. The counter-electrode 285 may also be patterned so that the current path for reading may include the region of the storage medium 260 that is right beneath the heater 250. Further, an insulator 290 may be used to avoid stray electrical currents between lead(s) 270 and the counter-electrode 285.

Some details of the inventive memory cell 200 are provided below. However, these descriptions are merely provided as guidelines and should not be considered as limiting in any way.

Heater

By way of comparison to the first aspect of the present invention, the heater 250 in the second aspect of the present invention may be used to realize writing and/or erasing, but may not be used by itself to perform a reading operation. In contrast to the first aspect, in this aspect, the heater material is more governed by heater stability requirements, where it may be preferred to use single phase, high melting point material such as certain IrRh, CrV alloys. Another good material class could be NiCr alloys, which show high stability and a low TCR. Other candidates could include PtCr, PtIr etc.

Storage Media

While in the first aspect of the present invention, a large thermal impedance of the storage medium was preferred, in the second aspect a large electrical impedance difference depending on the prior heat treatment is desired. Again, phase-change chalcogenide materials as well as certain organic materials may be very good candidates since their electrical resistances can change by several orders of magnitudes between the amorphous and crystalline phase.

Again, it should be noted that the storage medium 260 may be include different materials serving other purposes besides the storage of information. For example, in some cases the storage medium 260 may include dielectrics to avoid breakdown issues.

Leads

Although as in the first aspect of the invention, the lead resistance should be low, the preferred lead resistance in the memory cell 200 is not quite as stringent as in the memory cell 100. Since typically the electrical resistance of the phase-change is very high, the lead contribution to the background of the signal will be low even if heater resistance is on the same order of magnitude as the lead resistance.

It should also be pointed out that for the heating (i.e., writing/erasing), the lead resistance is not quite as important since the temperature rise scales with power per unit length. In other words, if the same amount of power is dissipated in a e.g. radius, which is 10 times larger, the results are temperatures rises which are decreased by a factor of 10 times.

Counter-electrode

The counter-electrode 285 may be patterned into the substrate, where the size of the electrode may approximate (e.g., match) the size of the heater 250. That is, the counter-electrode 285 may be integrally-formed with a conductive substrate 280. In some cases, the counter-electrode 280 may not have to be patterned.

It is preferred that the counter-electrode 285 has a high thermal conductivity to bias the heat flow through the bit region 275 and to avoid spreading and interfering with possible neighboring memory cells. For example, the counter-electrode 285 may also include an upper portion of a conductive susbstrate 285 which is surrounded by an insulator 290 such as $SiO_2$. Typically, it is preferred that the electrical resistance of the counter-electrode 285 is low in order to enhance the read contrast.

Particular Embodiments

Figure 5A:
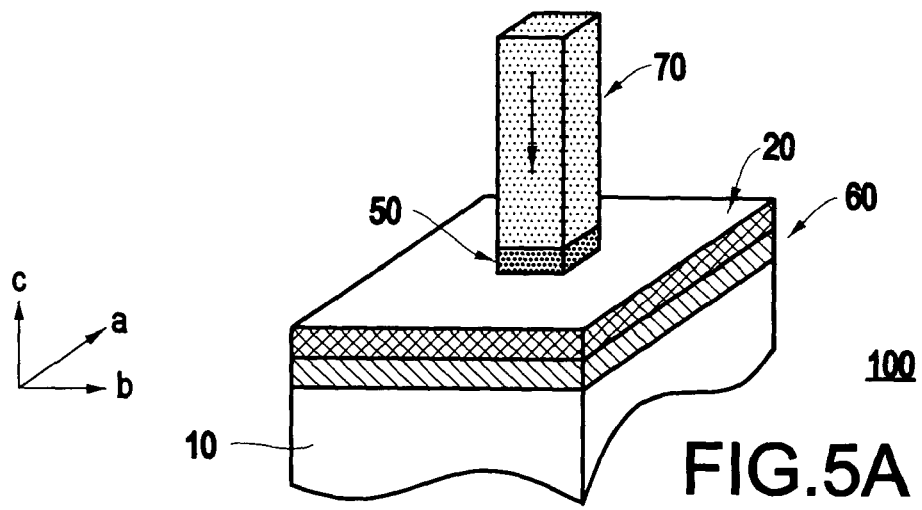
FIGS. 5A–C illustrate a possible embodiment of the memory cell 200 according to a first aspect of the invention.
Figure 5B:
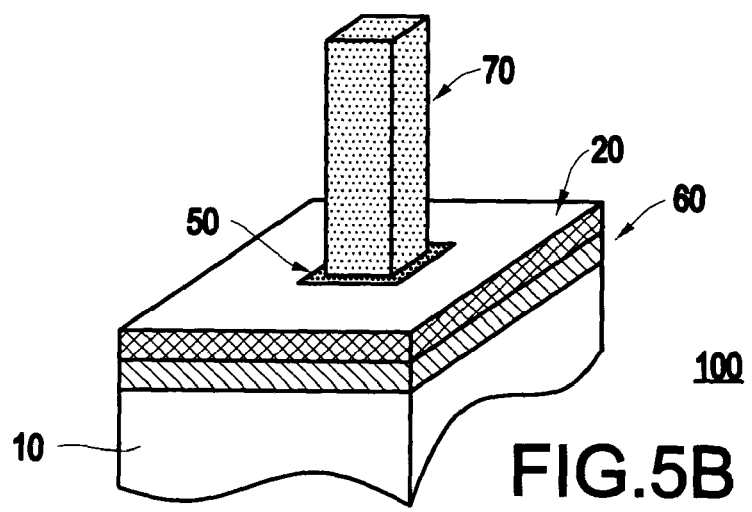
Figure 5C:
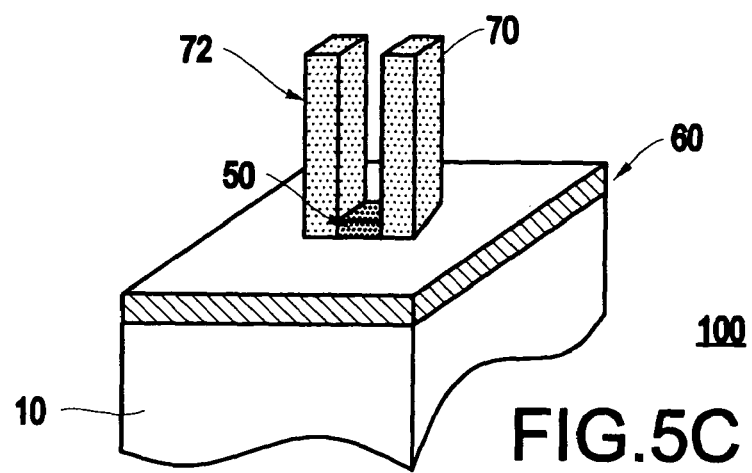

FIGS. 5A–5C illustrate some practical examples of the first aspect of the present invention. For example, in FIG. 5A, a lead 70 brings the current, preferably from the source of a transistor (e.g., field-effect transistor), to the heater 50. Current flow in the lead 70 is indicated by the arrow in FIG. 5A. The lead 70 may be made of a low resistive material such as Cu. By way of comparison, the heater 50 may be a highly electrically resistive material such as SiC with a large TCR (about 1%/K).

Further, the heater 50 may be formed on a thin film (e.g., less than 20 nm thick) of metal (e.g., platinum) which represents the electrical ground 20. In terms of the electrical conductivities, it is preferred to have about 100× larger electrical conductivity of the lead 70 with respect to the heater 50 and about 10× larger electrical conductivity of the electrical ground 20 with respect to the heater 50. The electrical ground 20 should also be thin (e.g., having a thickness c of about 20 nm as shown in FIG. 5A) with respect to the lateral dimensions (e.g., dimensions a, b as shown in FIG. 5A) of the heater 50.

The storage medium 60 may be located directly under the electrical ground 20. As a substrate 10, a good thermal conductor may be chosen to provide a thermal ground. For example, the memory cell structure may be embedded in a dielectric, preferably low thermal conductivity material such as SILK or photoresist.

It is noted that the thin electrical ground layer 20 may diminishes the contrast ratio for reading if the lateral dimensions of the heater 50 become comparable to the thicknesses of the electrical ground layer 20. The reason for this is that the electrical ground layer 20, which is typically a good electrical and (thus) thermal conductor, will contribute to the spreading of the heat and thus wash out the contrast from the bit underneath the heater 50.

However, simple electrical and thermal modeling calculations suggest that a contrast ratio of thermal resistances for the phase-change storage medium 60 (e.g., as noted above) of about 1.5 can be obtained, assuming a 1 $\mu m^2$ area heater 50, which should provide enough contrast for a reliable reading.

If the lateral dimensions of the heater 50 are further reduced, it may be preferred to embed the heater 50 into the electrical ground layer 20 such as shown in FIG. 5B. One way this could be achieved is by locally oxidizing a metal film and then connecting the oxidized areas, which will act as a heater 50, to the lead 70.

Another arrangement which may avoid the electrical ground layer 20, is shown in FIG. 5C. The ground is realized by a lead 72 which is directly on the storage medium 60. As an advantage, the arrangement in FIG. 5C may reduce the heat flow into the leads 70, 72 because the surface area between heater 50 and leads 70, 72 is drastically reduced. As it is clear, the designs proposed in FIG. 5A–5B should try to avoid significant power flow into the leads by providing a poor thermal connection to the leads.

Figure 6A:
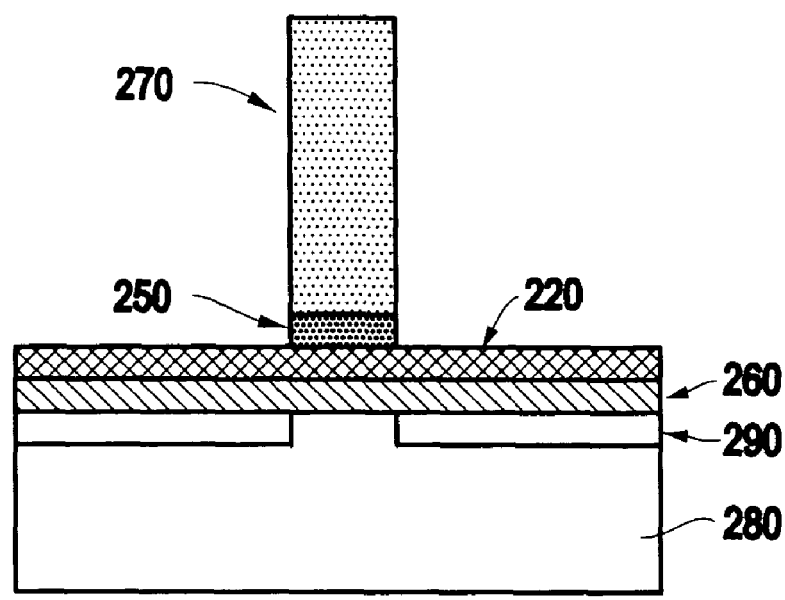
FIGS. 6A–B illustrate cross-sectional and plan views, respectively, of some practical examples of the memory device 200 according to a second aspect of the present invention.
Figure 6B:
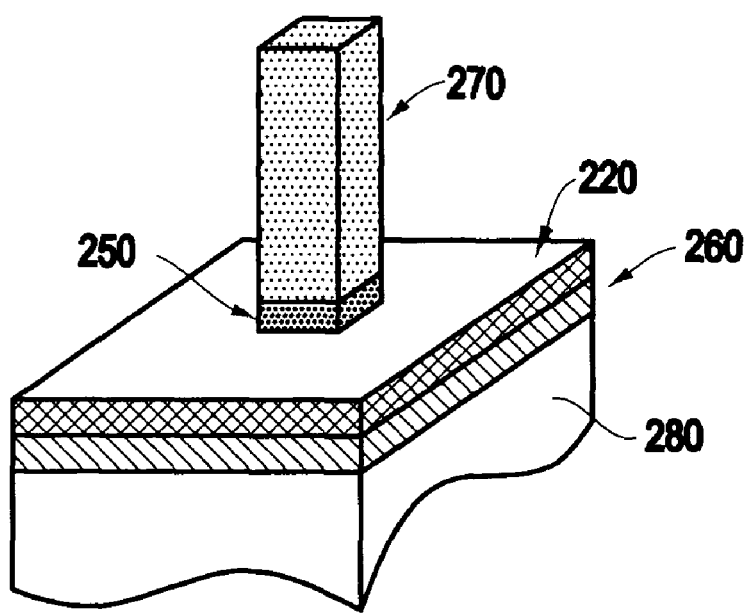

FIGS. 6A–6B illustrate cross-sectional and plan views, respectively, of some practical examples of the second aspect of the present invention. By way of comparison to the example in FIG. 5A, in these examples shown in FIGS. 6A–6B, the substrate layer is patterned to generate a counter-electrode 280 surrounded by insulators 290 to provide the possibility of electrical reading of the storage medium 260. In this particular situation, the electrical ground 220 for writing/erasing is disconnected and the current path goes through the storage medium 260 to sense the electrical resistance.

Third Aspect

FIGS. 7A–7D illustrate some practical examples of a memory device 700 (e.g., memory chip) according to a third aspect of the present invention. The inventive memory device 700 may include include a plurality of memory cells.

For example, as shown in FIG. 1A, each of the memory cells may include a heater 701 and a storage medium 702 (which is on substrate 703).

For example, the memory cells may include memory cell 100 according to a first aspect of the present invention, in which case the heater 701, storage medium 702 and substrate 703, may include heater 50, storage medium 60, and substrate 10, respectively (e.g., as shown in FIG. 1D). The memory cells may also include memory cell 200 according to a second aspect of the present invention, in which case the heater 701, storage medium 702 and substrate 703, may include heater 250, storage medium 260, and substrate 280 (e.g., a patterned conductive substrate which includes counter-electrode 285), respectively (e.g., as shown in FIG. 4B).

Specifically, the memory device 700 may include a memory chip having a plurality of memory cells 100, 200 in accordance the present invention on a chip (e.g., wafer). The memory device 700 may also include control electronics (e.g., transistor 795) suitable for enabling reading/writing/erasing of the individual memory cells 100, 200.

Figure 7A:
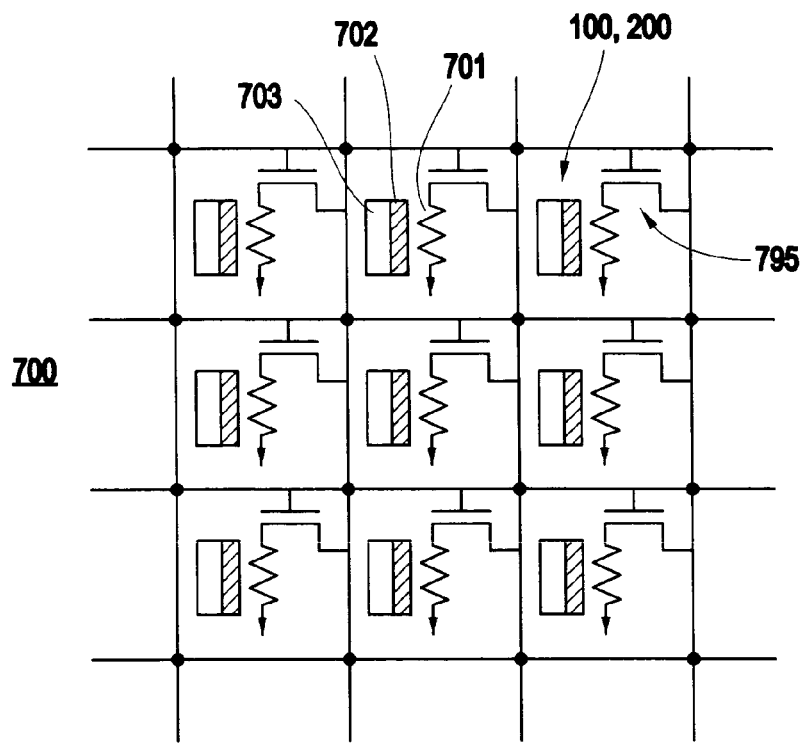

For example, FIG. 7A provides an electrical circuit diagram illustrating how a memory chip 700 (e.g., cross-point memory chip) could be arranged with the thermal memory cell 100, 200 of the present invention. In this simple scheme, an additional device or devices (e.g., a transistor 795 associated with each memory cell) may be used to ensure correct addressing by the control electronics, and facilitate a reading/writing/erasing of information in the storage medium.

In operation, for example, a voltage applied to one of the horizontal transmission lines may open the gates of all transistors in a certain row of the memory chip, selecting a row of memory cells in the memory chip. A voltage applied to the one of the vertical transmission lines may then apply a source current to the source of all transistors in that column, selecting a column of memory cells in the memory chip. Consequently, this voltage will supply current to only one of the heaters.

Figure 7B:
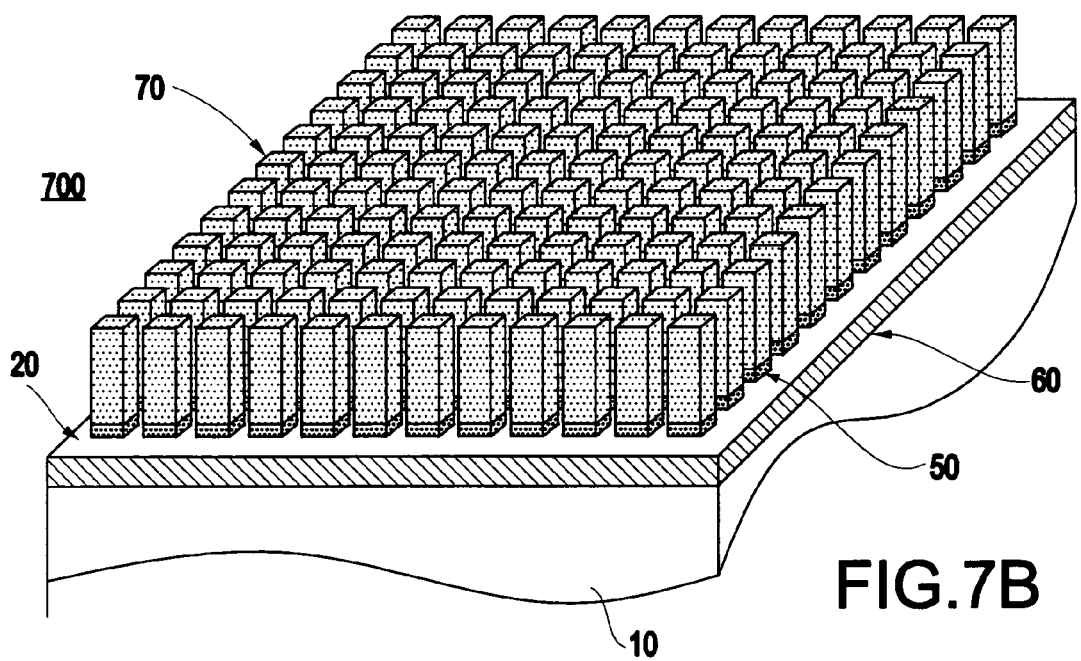

FIG. 7B illustrates how the inventive memory cell (e.g., a plurality of memory cells 100, 200) could be physically arranged to form a memory chip (e.g., cross-point memory chip) 700. It should be also noted that the memory cells in memory device 700 may include both memory cell 100 and memory cell 200.

For example, FIG. 7C illustrates a circuit diagram for a memory chip where reading is realized by measuring the electrical impedance of the storage medium. Further, FIG. 7D illustrates a circuit diagram for a memory chip where writing and erasing are realized via indirect heating and thereby program the electrical impedance of the storage medium.

Specifically, as shown in FIGS. 7C–7D, a diode 798 (e.g., an additional diode) may be added to each memory cell. For writing, erasing and reading, the gate of the transistor may be opened in a certain row. For writing and erasing, a voltage above the threshold of the diode may be applied to a certain column. In this case, the current will flow through the heater, indirectly heating the storage media. For reading, a voltage below the threshold of the diode may be used, and the electrcial impedance of the storage media could be measured.

Figure 8A:
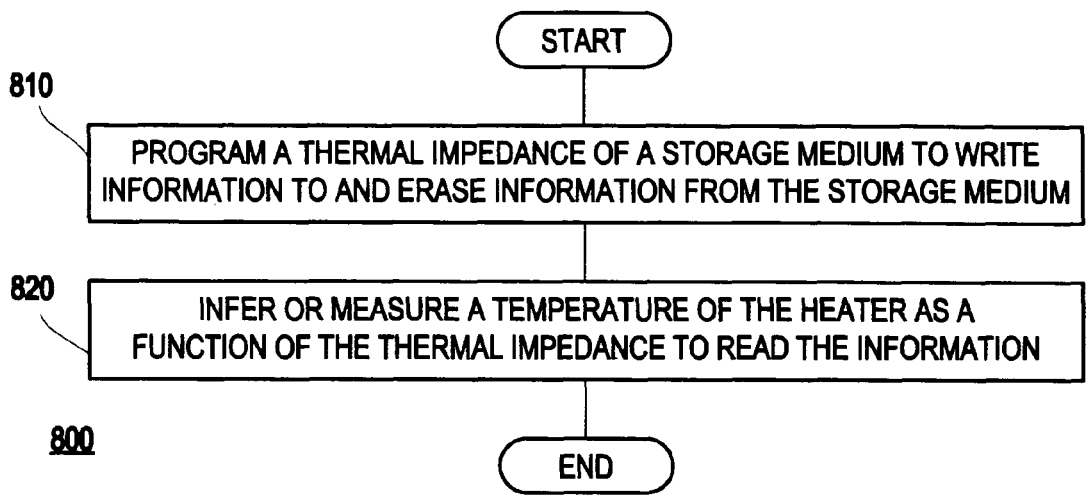
FIGS. 8A–8B illustrate inventive information processing methods 800 and 850, respectively according to the present invention.
Figure 8B:
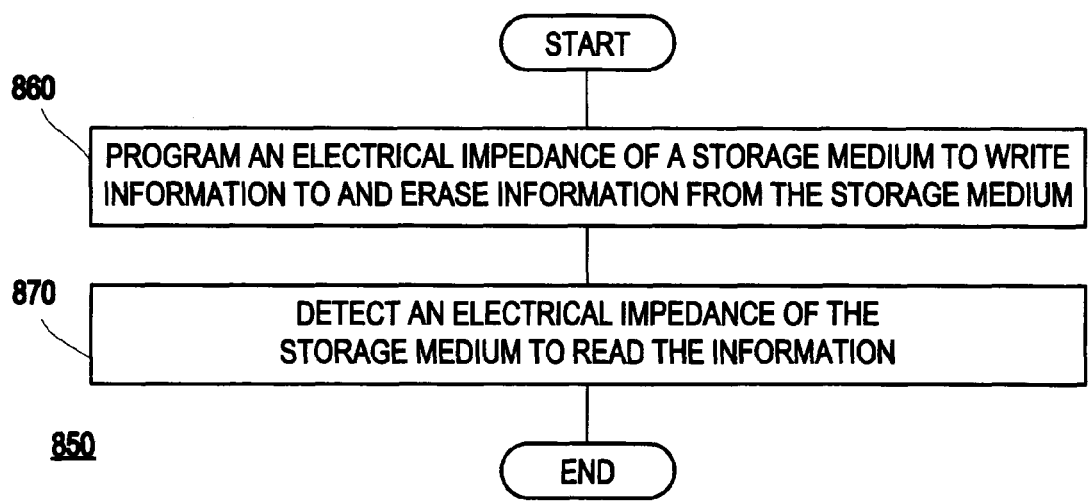

Referring again to the drawings, FIGS. 8A–8B illustrate inventive information processing methods 800 and 850, respectively according to the present invention. As shown in FIG. 8A, the inventive method includes programming (810) a thermal impedance of a storage medium to write information to and erase information from the storage medium, and one of inferring and measuring (820) a temperature of the heater as a function of the thermal impedance to read the information. Specifically, the inventive method 800 may be performed using the inventive memory cell 100.

Further, as shown in FIG. 8B, the inventive method 850 includes programming (860) an electrical impedance of a storage medium to write information to and erase information from the storage medium, and detecting (870) an electrical impedance of the storage medium to read the information.

In addition, the present invention includes programmable storage medium tangibly embodying a program of machine-readable instructions executable by a digital processing apparatus to perform an information processing method 800 or 850.

With its unique and novel features, the present invention provides a memory cell which makes controlling of the write/erase process much easier than in conventional devices. Specifically, the present invention provides a memory cell in which the primary current path for reading/writing/erasing does not necessarily involve the storage medium (e.g., the phase-change media) directly.

While the invention has been described in terms of preferred embodiments, those skilled in the art will recognize that the invention can be practiced with modification within the spirit and scope of the appended claims.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A memory cell comprising:
   a storage medium having a programmable thermal impedance; and
   a heater in thermal communication with said storage medium, for programming said thermal impedance,
   wherein a primary current path for at least one of reading information from said storage medium, writing information to said storage medium, and erasing information from said storage medium, is outside of said storage medium.

2. The memory cell according to claim 1, wherein a primary current path for reading, writing and erasing information to said storage medium is outside of said storage medium.

3. The memory cell according to claim 1, wherein said heater is utilized as a temperature sensor to one of infer end measure said thermal impedance of said storage medium to read information.

4. The memory cell according to claim 1, further comprising:
   a substrate formed adjacent to said storage medium.

5. The memory cell according to claim 1, wherein said heater is controlled to write information to said storage medium, and read and erase information from said storage medium.

6. The memory cell according to claim 1, further comprising:
   at least one lead connected to said heater, for supplying power to said heater.

7. The memory cell according to claim 1, wherein said heater comprises at least one of a posistor material, a ceramic material, an oxide and a semiconductor material.

8. The memory cell according to claim 1, wherein said heater comprises at least one of a tunnel junction, a thermocouple, a negative temperature coefficient thermistor, and a positive temperature coefficient thermistor.

9. The memory cell according to claim 1, wherein said storage medium has a first thermal impedance representing a "1" bit stored in said storage medium, and a second thermal impedance representing a "0" bit stored in said storage medium.

10. The memory cell according to claim 1, wherein said heater is electrically insulated from said storage medium.

11. The memory cell according to claim 1, wherein a primary current path for at least one of reading information from said storage medium, and writing information to said storage medium is outside of said storage medium.

12. The memory cell according to claim 1, wherein an information state of said storage medium is based on a thermal impedance of said storage medium.

13. The memory cell according to claim 1, wherein said heater is formed on said storage medium and comprises a largest dimension which is less than micron.

14. The memory cell according to claim 1, wherein said heater programs said thermal impedance by heating said storage medium.

15. The memory cell according to claim 14, further comprising:
 a temperature sensor which one of measures and infers said thermal impedance of said storage medium to read information.

16. The memory cell according to claim 1, wherein an electrical resistance of said heater is used to read information.

17. The memory cell according to claim 16, wherein said electrical resistance of said heater is changed by a stray current path.

18. The memory cell according to claim 1, wherein said storage medium comprises a phase-change medium having a phase-dependent thermal impedance.

19. The memory cell according to claim 18, wherein a first phase of said phase-change medium has a first thermal impedance, and a second phase of said phase-change medium has a second thermal impedance which is different from said first thermal impedance.

20. The memory cell according to claim 19, wherein information is written to said storage medium by heating said storage medium from a crystalline phase to an amorphous phase, and information is erased from said storage medium by heating said storage medium from an amorphous phase to a crystalline phase.

21. The memory cell according to claim 1, wherein said heater is formed adjacent to said storage medium.

22. The memory cell according to claim 21, wherein said storage medium comprises a bit region located adjacent to said heater, and wherein said thermal impedance is programmed in said bit region.

23. The memory cell according to claim 22, wherein a phase of material in said bit region is partially converted during writing and erasing.

24. The memory cell according to claim 1, wherein said storage medium comprises a phase change medium having more than two phases, each phase having a different thermal impedance.

25. The memory cell according to claim 24, wherein said thermal impedance represents a different bit, so that said storage medium has a capacity for storing more than two different bits.

26. A memory cell, comprising:
 a storage medium having a programmable electrical impedance;
 a heater formed on said storage medium and in direct thermal communication with said storage medium, for programming said electrical impedance; and
 a counter-electrode in electrical communication with said storage medium,
 wherein said storage medium is formed between said heater and a substrate which serves as a heat sink.

27. The memory cell according to claim 26, wherein said heater programs said electrical impedance by heating said storage medium.

28. The memory cell according to claim 26, wherein said counter-electrode facilitates a detection of said electrical impedance, to read information from said storage medium.

29. The memory cell according to claim 26, wherein said heater is controlled to write data to and erase data from said storage medium, and acts as an electrode to read data from the storage medium.

30. The memory cell according to claim 26, wherein said storage medium comprises a phase-change medium having a phase-dependent electrical impedance.

31. The memory cell according to claim 26, wherein an information state of said storage medium is based on a electrical impedance of said storage medium.

32. The memory cell according to claim 26, wherein said counter-electrode comprises a patterned portion of said substrate.

33. The memory cell according to claim 26, wherein said storage medium comprises a bit region located between said heater and counter-electrode, and wherein said electrical impedance is programmed in said bit region.

34. The memory cell according to claim 33, wherein said storage medium has a first electrical impedance representing a "1" bit storage in said storage medium, and a second electrical impedance representing a "0" bit stored in said storage medium.

35. The memory cell according to claim 33, wherein said storage medium comprises a phase change medium having more than two phases, each phase having a different electrical impedance.

36. The memory cell according to claim 35, wherein each said electrical impedance represents a different bit, so that said storage medium has a capacity for storing more than two different bits.

37. A memory device comprising:
 a plurality of memory cells, each memory cell comprising:
 a storage medium having a programmable thermal impedance; and
 a heater in thermal communication with said storage medium, for programming said thermal impedance,
 wherein a primary current path for at least one of reading information from said storage medium, writing information to said storage medium, and erasing information from said storage medium, is outside of said storage medium.

38. A memory device according to claim 37, further comprising:
 at least one control device associated with each memory cell to facilitate writing information to and erasing information from said storage medium, and to read information from said storage medium.

39. A memory device comprising:
a plurality of memory cells, each memory cell comprising:
a storage medium having a programmable electrical impedance;
a heater in thermal communication with said storage medium, for programming said electrical impedance; and
a counter-electrode in electrical communication with said storage medium, for facilitating a reading of said electrical impedance by said heater.

40. An information processing method, comprising:
programming a thermal impedance of a storage medium to write information to and erase information from said storage medium; and
one of inferring and measuring a temperature of said heater as a function of said thermal impedance to read said information.

41. An information processing method, comprising:
using a heater which is formed on a storage medium and is in direct thermal communication with said storage medium, to program an electrical impedance of said storage medium, and to write information to and erase information from said storage medium; and
detecting an electrical impedance of said storage medium to read said information using a counter electrode,
wherein said storage medium is formed between said heater and a substrate which serves as a heat sink.

42. A programmable storage medium tangibly embodying a program of machine-readable instructions executable by a digital processing apparatus to perform an information processing method comprising:
programming a thermal impedance of a storage medium to write information to and erase information from said storage medium; and
one of inferring and measuring a temperature of said heater as a function of said thermal impedance to read said information.

43. A programmable storage medium tangibly embodying a program of machine-readable instructions executable by a digital processing apparatus to perform an information processing method comprising:
using a heater which is formed on a storage medium and is in direct thermal communication with said storage medium, to program an electrical impedance of said storage medium, and to write information to and erase information from said storage medium; and
detecting an electrical impedance of said storage medium to read said information using a counter electrode,
wherein said storage medium is formed between said heater and a substrate which serves as a heat sink.

* * * * *